(12) United States Patent
Lin et al.

(10) Patent No.: US 6,255,229 B1
(45) Date of Patent: Jul. 3, 2001

(54) METHOD FOR FORMING SEMICONDUCTOR DIELECTRIC LAYER

(75) Inventors: Kevin Lin, Taipei Hsien; Horng-Nan Chern, Tainan Hsien; Kun-Chi Lin, Hsinchui, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/074,780

(22) Filed: May 8, 1998

(30) Foreign Application Priority Data

Feb. 27, 1998 (TW) ................................. 87102845

(51) Int. Cl.⁷ ........................... H01L 21/469; H01L 21/31
(52) U.S. Cl. ............................................ 438/761; 438/786
(58) Field of Search ...................................... 438/786, 761

(56) References Cited

U.S. PATENT DOCUMENTS 5,930,627 * 7/1999 Zhou et al. .
5,972,800 * 10/1999 Hasegawa .

* cited by examiner

*Primary Examiner*—John F. Niebling
*Assistant Examiner*—Josetta I. Jones

(57) ABSTRACT

A method for forming a semiconductor dielectric layer comprising the steps of providing a substrate having a plurality of semiconductor devices already formed thereon, and then forming a first dielectric layer over the substrate. Next, a silicon oxy-nitride layer is formed over the first dielectric layer, and finally a second dielectric layer is formed over the silicon oxy-nitride layer.

12 Claims, 1 Drawing Sheet

METHOD FOR FORMING SEMICONDUCTOR DIELECTRIC LAYER

CROSS-REFERENCE TO RELATED APPLICATION

This application claims the priority benefit of Taiwan application Ser. No. 87102845, filed Feb. 27, 1998, the full disclosure of which is incorporated herein by reference.

BACKGROUND OF THE INVENTION

1. Field of Invention

The present invention relates to a method for forming an integrated circuit structure. More particularly, the present invention relates to a method for forming a semiconductor dielectric layer using silicon-oxy-nitride ($SiO_xN_y$) rather than the conventional silicon nitride ($Si_3N_4$), thereby eliminating some of the defects of a conventional manufacturing process.

2. Description of Related Art

In the fabrication of very large scale integration (VLSI) circuits, hundreds of thousand of metal oxide semiconductor (MOS) transistors can be packed within an area just 1 to 2 $cm^2$ on the wafer surface. As the level of integration is further increased, the density of metallic lines that are used for interconnecting various transistors or other electronic devices in the integrated circuit will also get higher. These vast numbers of metallic interconnection lines are going to cross over a variable number of inter-layer dielectric (ILD) layers in order to provide the necessary connectivity.

In the conventional VLSI manufacturing technique, the insulating layer within which contact openings or interconnects are formed is usually a dielectric material with a dielectric constant approaching 1. Preferably, the inter-layer dielectric layer is formed by a chemical vapor deposition (CVD) method, and then the layer is planarized. Finally, the ILD layer is patterned to form the necessary contact openings for subsequent deposition of polysilicon or metal. Typical material suitable for forming contact openings in the inter-layer dielectric layer includes silicate glass preferably deposited to a thickness of between 5000 Å to 10000 Å. Examples of the silicate glass material include boro-phospho-silicate glass (BPSG) and phospho-silicate glass (PSG). When these inter-layer dielectric materials are heated to a temperature higher than their respective glass transition temperatures, for example, between 700° C. to 900° C., these materials will density and reflow.

Normally, to lower the reflow temperature of silicate glass, a small amount of dopants is added. For example, phosphorus or phosphorus-containing organic compound such as trimethylphosphate (TMP) is used as a dopant to form phospho-silicate glass and a boron-containing compound such as trimethylborate (TMB) and phosphorus-containing organic compound are used as dopants to form boro-phospho-silicate glass (BPSG). Reflow of the inter-layer dielectric layer is necessary. Reflow enables the inter-layer dielectric material to flow smoothly over surfaces, thus permitting various devices to be covered and allowing gaps formed between interconnecting lines to be filled. Furthermore, reflow serves to provide a planarized surface for subsequent processing operations.

Phospho-silicate glass is mainly used as a passivation layer in the fabrication of VLSI circuits. This is because phospho-silicate glass has the ability to easily absorb water. However, phospho-silicate glass has a reflow temperature (greater than 1000° C.) very much higher than boro-phospho-silicate glass (less than 1000° C.). Therefore, most inter-layer dielectric layers are still formed using boro-phospho-silicate glass.

Normally, in a conventional fabricating method, a silicon nitride layer is deposited between a first inter-poly dielectric (IPD1) and a second inter-poly dielectric (IPD2) before a contact opening is formed. Preferably, the first inter-poly dielectric layer is a boro-phospho-silicate glass layer, which acts as the main body of the inter-layer dielectric layer and the second inter-poly dielectric layer is a phospho-silicate glass, a which serves as a passivation layer. The silicon nitride layer can act as an etching mask when a silicon dioxide layer is etched. Furthermore, the silicon nitride layer can serve as a protective layer preventing charging, which can lead to a change in the threshold voltage, when the second inter-poly dielectric (PSG layer) is deposited.

Although the formation of a silicon nitride layer in a conventional fabricating process is able to prevent the charging problem, the deposited silicon nitride layer has a rather high tensile stress of up to $10^{10}$ $dyne/cm^2$. This is especially serious for a silicon nitride layer formed by a low-pressure chemical vapor deposition (LPCVD) method. Consequently, whenever the tensile stress of the deposited silicon nitride thin film is beyond a certain tensile threshold boundary, cracks may appear which can affect subsequent semiconductor fabrication.

In addition, because a silicon nitride layer has a lower etching rate than an interpoly poly dielectric layer, etching will almost stop when the silicon nitride layer is reached during the etching operation to form a contact opening. Hence, the whole etching operation will be affected.

In light of the foregoing, there is a need to provide a better semiconductor dielectric layer.

SUMMARY OF THE INVENTION

Accordingly, the present invention is to provide a method for forming a semiconductor dielectric layer using silicon oxy-nitride instead of silicon nitride as the basic material. The silicon oxy-nitride layer, besides being capable of avoiding the formation of cracks, is also able to prevent the etching stop problem due to a difference in etching rate relative to surrounding layers.

To achieve these and other advantages and in accordance with the purpose of the invention, as embodied and broadly described herein, the invention provides a method for forming a semiconductor dielectric layer. The method comprises the steps of first providing a substrate having a plurality of semiconductor devices already formed thereon, and then forming a first dielectric layer over the substrate. Next, a silicon oxy-nitride layer is formed over the first dielectric layer, and then a second dielectric layer is formed over the silicon oxy-nitride layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
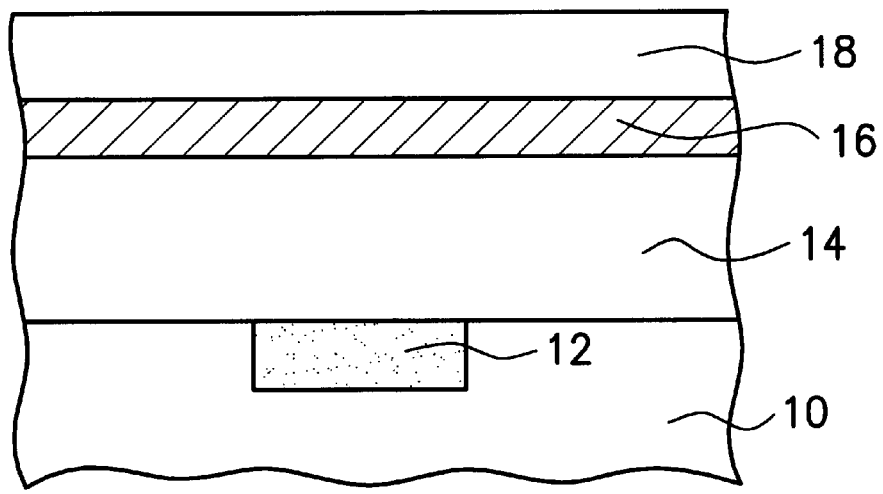
FIGS. 1 and 2 are cross-sectional views showing the progression of manufacturing steps in forming a semiconductor dielectric layer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
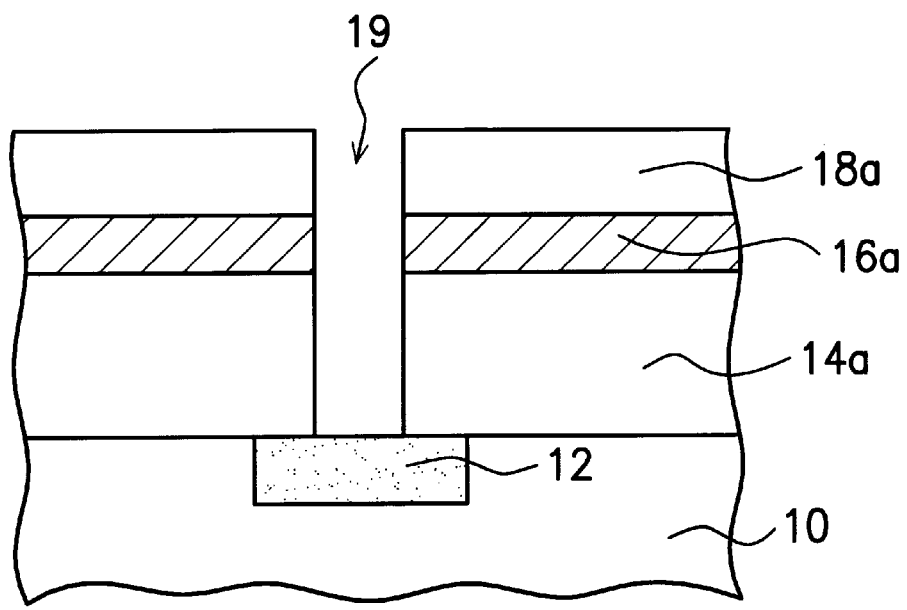

FIGS. 1 and 2 are cross-sectional views showing the progression of manufacturing steps in forming a semiconductor dielectric layer according to one preferred embodiment of this invention.

First, as shown in FIG. 1, a substrate 10 having a conductive region 12 is provided. A complete MOS device is not drawn in FIG. 1, only the conductive region 12 is shown. The conductive region 12 can be a source/drain region of an MOS device. Alternatively, the conductive region 12 can be the metallic layer or interconnect metallic layer in a gate structure. Next, a first dielectric layer 14, a silicon oxy-nitride layer 16 and a second dielectric layer 18 are sequentially formed over the substrate 10. The first dielectric layer 14 having a thickness of about 5000 Å to 1000 Å is formed preferably by depositing boro-phospho-silicate glass (BPSG) using a chemical vapor deposition method at a temperature of around 850° C. to 950° C. The silicon oxy-nitride layer 16 having a thickness of about 1000 Å to 2000 Å is formed preferably by depositing silicon oxy-nitride using a chemical vapor deposition method. The second dielectric layer 18 having a thickness of about 5000 Å to 10000 Å is formed preferably by depositing phospho-silicate glass (PSG) using a chemical vapor deposition method. Then, the phospho-silicate glass layer is allowed to reflow by heating to a temperature of around 950° C. to 1000° C.

The silicon oxy-nitride layer 16 is capable of ameliorating charging problems, thereby preventing a shift in threshold voltage. Furthermore, the silicon oxy-nitride layer 16 can prevent the formation of cracks, and the absence of these cracks will allow the unimpeded progress of the etching operation to form a contact opening.

Next, as shown in FIG. 2, the second dielectric layer 18, the silicon oxy-nitride layer 16 and the first dielectric layer 14 are patterned to form a contact opening 19 that exposes a portion of the conductive region 12 in the substrate 10. The contact opening 19 is surrounded by a second dielectric layer 18a, a silicon oxy-nitride layer 16a and a first dielectric layer 14a.

In the embodiment of this invention, the formation of a silicon oxy-nitride layer instead of a silicon nitride layer before the formation of an inter-layer dielectric layer (phospho-silicate glass layer) has advantages including:

(1) the charging problem, which may lead to a shift in threshold voltage, caused by depositing phospho-silicate glass over a silicon nitride layer, can be prevented.

(2) Tensile stress present in a silicon oxy-nitride layer is smaller than a silicon nitride layer. Therefore, cracks that may affect subsequent semiconductor fabrication are less readily formed.

(3) When a contact opening is formed by etching, the etching rate for a silicon oxy-nitride layer is relatively higher than a silicon nitride layer. Hence, etching will be slowed down less when the silicon oxy-nitride layer is encountered and a smoother etching operation can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming contact opening comprising the steps of:

providing a substrate having a conductive region;

sequentially forming a first dielectric layer, a silicon oxy-nitride layer and a second dielectric layer over the substrate, wherein the first dielectric layer and the second dielectric layer comprises a material other than silicon oxy-nitride; and patterning the second dielectric layer, the silicon oxy-nitride layer and the first dielectric layer to form a contact opening exposing a portion of the conductive region in the substrate.

2. The method of claim 1, wherein the step of forming the first dielectric layer includes an etching back operation.

3. The method of claim 1, wherein the step of forming the first dielectric layer includes a chemical vapor deposition method.

4. The method of claim 1, wherein the step of forming the first dielectric layer includes depositing boro-phospho-silicate glass.

5. The method of claim 4, wherein the first dielectric layer has a thickness between 5000 Å to 10000 Å.

6. The method of claim 1, wherein the step of forming the silicon oxy-nitride layer includes a chemical vapor deposition method.

7. The method of claim 1, wherein the silicon oxy-nitride layer has a thickness between 1000 Å to 10000 Å.

8. The method of claim 1, wherein the step of forming the second dielectric layer includes a chemical vapor deposition method.

9. The method of claim 1, wherein the step of forming the second dielectric layer includes depositing phospho-silicate glass.

10. The method of claim 9, wherein the second dielectric layer has a thickness between 5000 Å to 10000 Å.

11. A method for forming a semiconductor dielectric layer, comprising:

providing a substrate having a plurality of semiconductor devices already formed thereon;

forming a first dielectric layer over the substrate, wherein the first dielectric layer comprises a material other than silicon oxy-nitride;

forming a silicon oxy-nitride layer over the first dielectric layer, wherein the silicon oxy-nitride layer has a thickness of about 1000–2000 angstroms; and forming a second dielectric layer over the silicon oxy-nitride layer, wherein the second dielectric layer comprises a material other than silicon oxy-nitride.

12. The method of claim 1, wherein the method further comprises patterning the second dielectric layer, the silicon, oxy-nitride layer, and the first dielectric layer to form an opening to expose at least one of the semiconductor devices.

* * * * *